(12) United States Patent
Shi et al.

(10) Patent No.: US 10,057,976 B1
(45) Date of Patent: Aug. 21, 2018

(54) POWER-GROUND CO-REFERENCE TRANSCEIVER STRUCTURE TO DELIVER ULTRA-LOW CROSSTALK

(71) Applicant: Xilinx, Inc., San Jose, CA (US)

(72) Inventors: Hong Shi, Fremont, CA (US); Siow Chek Tan, Los Gatos, CA (US); Sarajuddin Niazi, Union City, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/692,975

(22) Filed: Aug. 31, 2017

(51) Int. Cl.
| | |
|---|---|
| *H01L 23/49* | (2006.01) |
| *H01L 23/64* | (2006.01) |
| *H01L 23/66* | (2006.01) |
| *H05K 1/02* | (2006.01) |
| *H01L 23/498* | (2006.01) |

(Continued)

(52) U.S. Cl.
CPC ....... *H05K 1/0231* (2013.01); *H01L 21/4853* (2013.01); *H01L 23/49816* (2013.01); *H01L 23/49833* (2013.01); *H01L 23/552* (2013.01); *H01L 23/642* (2013.01); *H01L 23/66* (2013.01); *H01L 24/11* (2013.01); *H01L 24/16* (2013.01); *H01L 24/81* (2013.01); *H05K 1/0233* (2013.01); *H01L 23/538* (2013.01); *H01L 23/5385* (2013.01); *H01L 23/5386* (2013.01); *H01L 25/0655* (2013.01); *H01L 2224/16225* (2013.01); *H01L 2224/81801* (2013.01); *H01L 2924/14* (2013.01); *H01L 2924/19011* (2013.01); *H01L 2924/19041* (2013.01); *H03H 7/0115* (2013.01); *H05K 1/181* (2013.01); *H05K 2201/10734* (2013.01)

(58) Field of Classification Search
CPC ......... H01L 23/49816; H01L 23/49833; H01L 23/552; H01L 23/642; H01L 23/66; H01L 23/538; H01L 23/5385; H01L 23/5386; H01L 24/11; H01L 24/16; H01L 24/81; H05K 1/0231; H05K 1/0233
See application file for complete search history.

(56) References Cited

U.S. PATENT DOCUMENTS

| | | |
|---|---|---|
| 7,949,979 B1 | 5/2011 | Alexander |
| 8,386,229 B1 | 2/2013 | Anderson et al. |
| (Continued) | | |

*Primary Examiner* — Ida M Soward
(74) *Attorney, Agent, or Firm* — Robert M. Brush

(57) ABSTRACT

An interface layout for a vertical interface of a first semiconductor component is disclosed. A first one or more conductors configured to carry power signals extends vertically from the first semiconductor component. A second one or more conductors configured to carry data signals extends vertically from the first semiconductor component. A third one or more conductors configured to carry ground signals extending vertically from the first semiconductor component. The first one or more conductors are further configured to shield and separate the second one or more conductors. A fourth one or more conductors extends horizontally from the first one or more conductors adjacent to and terminating proximal to the third one or more conductors. A fifth one or more conductors extending horizontally from the third one or more conductors adjacent to and terminating proximal to the first one or more conductors and the fourth one or more conductors. The fourth one or more conductors and the corresponding adjacent fifth one or more conductors form a plate capacitor.

20 Claims, 9 Drawing Sheets

(51) Int. Cl.
  *H01L 23/00* (2006.01)
  *H01L 21/48* (2006.01)
  *H01L 23/552* (2006.01)
  *H03H 7/01* (2006.01)
  *H01L 25/065* (2006.01)
  *H05K 1/18* (2006.01)
  *H01L 23/538* (2006.01)

(56) References Cited

U.S. PATENT DOCUMENTS

| | | | |
|---|---|---|---|
| 8,436,454 B2* | 5/2013 | Norman | H01L 23/50 |
| | | | 257/415 |
| 9,013,041 B2* | 4/2015 | Karikalan | H01L 23/538 |
| | | | 257/741 |
| 9,054,094 B2* | 6/2015 | Anthony | H01L 23/49822 |
| 9,054,096 B2 | 6/2015 | Erdmann | |
| 9,076,770 B2* | 7/2015 | Foster, Sr. | H01L 23/481 |
| 9,106,229 B1* | 8/2015 | Hutton | H03K 19/173 |
| 9,747,959 B2* | 8/2017 | Seo | G11C 7/10 |
| 2003/0122206 A1* | 7/2003 | Bhattarai | B81B 7/04 |
| | | | 257/415 |
| 2010/0059898 A1* | 3/2010 | Keeth | H01L 23/50 |
| | | | 257/777 |
| 2010/0258905 A1* | 10/2010 | Song | H01L 23/66 |
| | | | 257/532 |
| 2012/0187401 A1* | 7/2012 | Waki | H01L 21/565 |
| | | | 257/48 |
| 2013/0077420 A1* | 3/2013 | Iwai | G11C 29/76 |
| | | | 365/200 |
| 2014/0097547 A1* | 4/2014 | Kuroda | H01L 25/0657 |
| | | | 257/777 |
| 2017/0012023 A1* | 1/2017 | Song | H01L 25/0657 |
| 2017/0350933 A1* | 12/2017 | Uematsu | G01R 31/041 |
| 2018/0012866 A1* | 1/2018 | Choi | H01L 25/0657 |

* cited by examiner

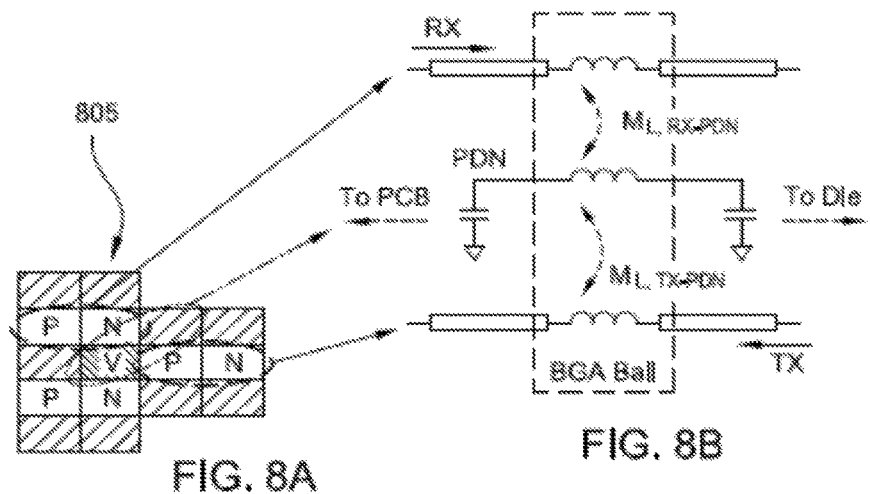
FIG. 8A
FIG. 8B
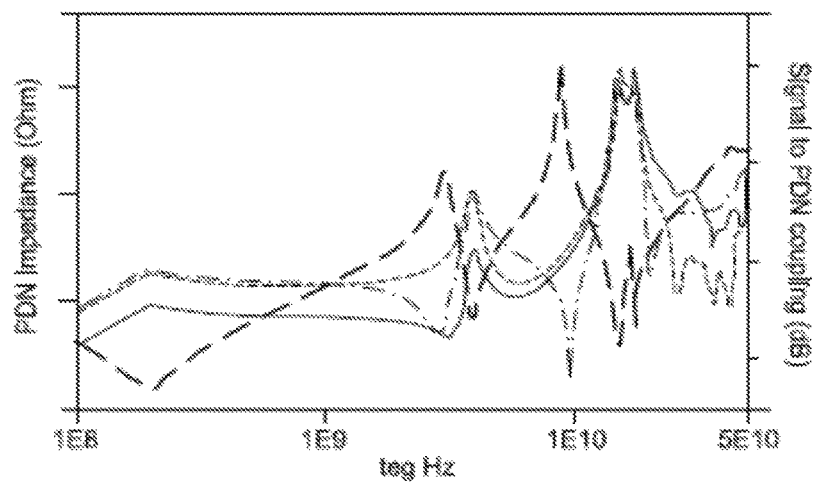
FIG. 8C
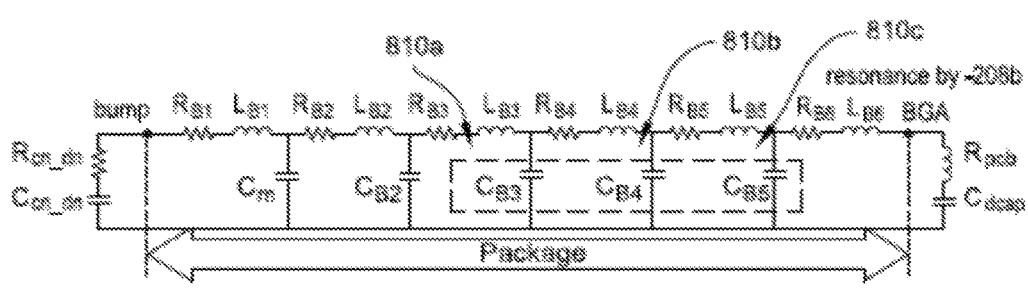
FIG. 8D

US 10,057,976 B1

POWER-GROUND CO-REFERENCE TRANSCEIVER STRUCTURE TO DELIVER ULTRA-LOW CROSSTALK

TECHNICAL FIELD

Examples of the present disclosure generally relate to chip packages and electronic devices having the same. In particular, examples of the present disclosure relate to an interface layout for a vertical interface of a first semiconductor component that provides one or more power pins to shield data signal pins and conductors extending vertically from the first component.

BACKGROUND

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packages include one or more stacked components such as integrated circuit (IC) dies, through-silicon-via (TSV) interposer, and a package substrate, with the chip package itself stacked on a printed circuit board (PCB). The IC dies may include memory, logic, MEMS, RF or other IC device.

As the number and density of signal transmission routings, such as solder connections, through a vertical interface between any of these stacked components becomes greater, crosstalk between adjacent routings becomes increasingly problematic. The risk of increased crosstalk is also present stacked PCBs.

Conventional escape routing techniques utilized at the interface between chip package components and stacked PCBs generally employ multiple power and ground conductors for shielding signal conductors from crosstalk for vertically spacing horizontal routings. However, employing mixed power and ground conductors rather than ground only conductor to shield signal conductors does not result in adequate protection against cross talk due to resonance of a power-ground network in a pinout area of an overlying chip in the chip package. Therefore, a need exists for an improved vertical connection interfaces between stacked components of chip packages and PCBs that reduces crosstalk potential as compared what is conventionally utilized in the art.

SUMMARY

Examples of the present disclosure relate to an interface layout for a vertical interface of a first semiconductor component that provides one or more power pins to shield data signal pins and conductors extending vertically from the first component. The techniques described herein allow for increased signal connection density while reducing potential for crosstalk.

In one example, an interface layout for a vertical interface of a first semiconductor component is disclosed. A first one or more conductors configured to carry power signals extends vertically from the first semiconductor component. A second one or more conductors configured to carry data signals extends vertically from the first semiconductor component. A third one or more conductors configured to carry ground signals extending vertically from the first semiconductor component. The first one or more conductors are further configured to shield and separate the second one or more conductors. A fourth one or more conductors extends horizontally from the first one or more conductors adjacent to and terminating proximal to the third one or more conductors. A fifth one or more conductors extending horizontally from the third one or more conductors adjacent to and terminating proximal to the first one or more conductors and the fourth one or more conductors. The fourth one or more conductors and the corresponding adjacent fifth one or more conductors form a plate capacitor.

In another example, a first plurality of conductors configured to carry power signals extends vertically from a first semiconductor component comprising circuitry to a second semiconductor component stacked below the first component. A second plurality of conductors configured to carry data signals extending vertically from the first semiconductor component comprising circuitry to the second semiconductor component. A third plurality of conductors configured to carry ground signals extending vertically from the first semiconductor component to the second semiconductor component. The first plurality of conductors are further configured to shield and separate the second plurality of conductors. A fourth plurality conductors extending horizontally in the second component from the first plurality of conductors adjacent to and terminating proximal to the third plurality of conductors. A fifth plurality conductors extending horizontally in the second component from the third plurality of conductors adjacent to and terminating proximal to the first plurality of conductors and the fourth plurality of conductors. Each pair of conductors comprising one conductor of the fourth plurality of conductors and a corresponding adjacent conductor of the fifth plurality of conductors forms a plate capacitor.

BRIEF DESCRIPTION OF THE DRAWINGS

So that the manner in which the above recited features of the present invention can be understood in detail, a more particular description of the invention, briefly summarized above, may be had by reference to examples, some of which are illustrated in the appended drawings. It is to be noted, however, that the appended drawings illustrate only typical examples of this invention and are therefore not to be considered limiting of its scope, for the invention may admit to other equally effective examples.

FIG. 8A shows an exemplary horizontal layout of signal, power, and ground connections between two transceivers.

FIG. 8B shows an equivalent electrical schematic representation of transmit signal impedance, receive signal impedance and a power ground layout impedance having plate capacitors formed therebetween.

FIG. 8C is a graph illustrating a relationship between crosstalk and frequency for the layout shown in FIGS. 8A and 8B.

FIG. 8D is an equivalent schematic circuit diagram for a power-ground distribution transmission line circuit that includes plate capacitors formed between vertical conductors as described in FIG. 3.

To facilitate understanding, identical reference numerals have been used, where possible, to designate identical elements that are common to the figures. It is contemplated that elements of one example may be beneficially incorporated in other examples.

DETAILED DESCRIPTION

Examples of the disclosure generally provide an interface layout for a vertical interface of a first semiconductor component that provides one or more power pins to shield data signal pins and conductors extending vertically from the first component. The techniques described herein allow for increased signal connection density while reducing the potential for crosstalk. Specifically, the interface layout utilizes more power connections surrounding a plurality of signal conductors than conventional interface layouts. The interface layout also employs vertical power and ground conductors extending vertically from power and ground pins on a die to one or more printed circuit boards. Power and ground conductors extend horizontally from corresponding vertical power and ground conductors to form plate capacitors that function as low pass filters that further reduce crosstalk between the stacked components.

Figure 1:
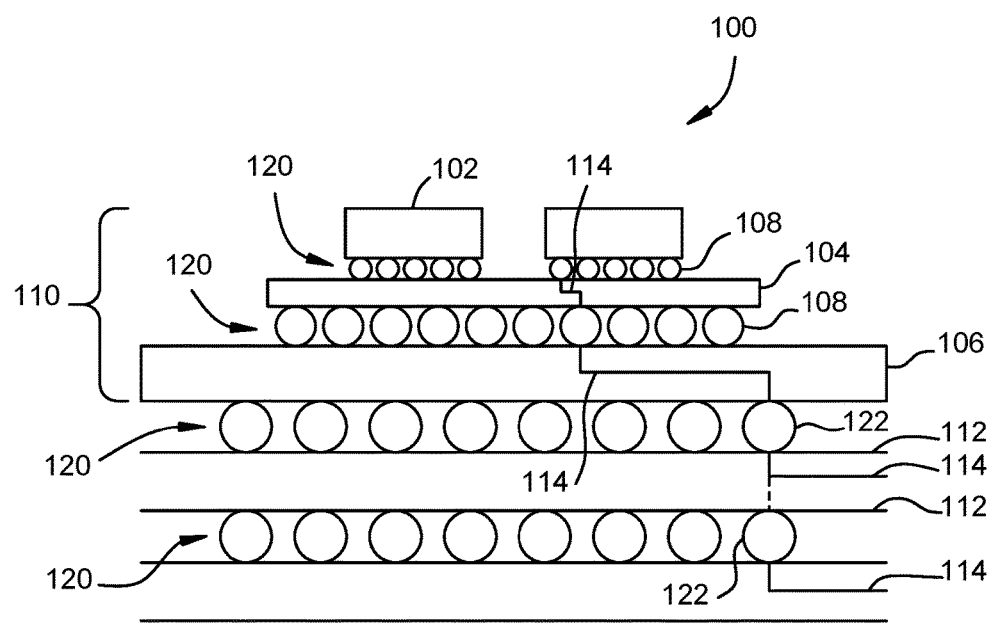
FIG. 1 is a cross sectional schematic view of an integrated chip package mounted on a printed circuit board illustrating a number of horizontal and vertical interfaces between components.

Turning now to FIG. 1, an exemplary integrated chip (IC) package 100 is schematically illustrated mounted on a printed circuit board (PCB) 112 illustrating a number of vertical interfaces 120 between components. The components between which a vertical interfaces 120 may be defined include the chip package 100 and PCB 112 themselves; at least two of an IC die 102, an optional through-substrate-via (TSV) interposer 104, and a package substrate 106; and two stacked PCBs 112. The IC dies 102 may be programmable logic devices, such as field programmable gate arrays (FPGA), memory devices, optical devices, processors or other IC logic structures. Optical devices include photo-detectors, lasers, optical sources, and the like.

In one example, the chip package 100 includes one or more IC dies 102 that may be connected directly to the package substrate 106, for example as flip chip ball grid array (FCBGA), ball grid array (BGA), wire bond and the like. In another alternative example, the chip package 100 may be configured to have two or more IC dies 102 in a vertically stacked configuration, also known as a 3D or stacked die package. In one example, the chip package 100 includes one or more IC dies 102 that may be connected via the interposer 104 to the package substrate 106. It is contemplated that the chip package 100 may have other configurations. Although one IC die 102 is shown in FIG. 1, the number of IC dies may range from one to as many as can be fit within the chip package 100 in order to meet design criteria.

The interposer 104 includes conductors 124, for electrically connecting the circuitry of the IC die 102 to circuitry 114 of the package substrate 106. The circuitry 114 of the interposer 104 may optionally include transistors. Solder connections 108, such as micro-bumps, may be utilized to mechanically and electrically connect the circuitry of the IC die 102 to the circuitry 114 of the interposer 104. Solder connections 108, such as package bumps (i.e., "C4 bumps,") are utilized to provide an electrical connection between the circuitry 114 of the interposer 104 and the circuitry 114 of the package substrate 106. The package substrate 106 may be mounted and electrically connected to the PCB 112, utilizing solder connections 122, such as solder balls, wire bonding or other suitable technique. The PCBs 112 includes conductors 126, for electrically connecting the circuitry 114 of the package substrate 106 to circuitry 114 of the PCBs 112. When two PCBs 112 are optionally stacked, the circuitry 114 of one of the PCBs 112 may be coupled to the circuitry 114 of the other PCB 112 utilizing solder connections 122. The solder connections 108, 122 connect the facing surfaces of adjacent components comprising the vertical interfaces 120.

Figure 2:
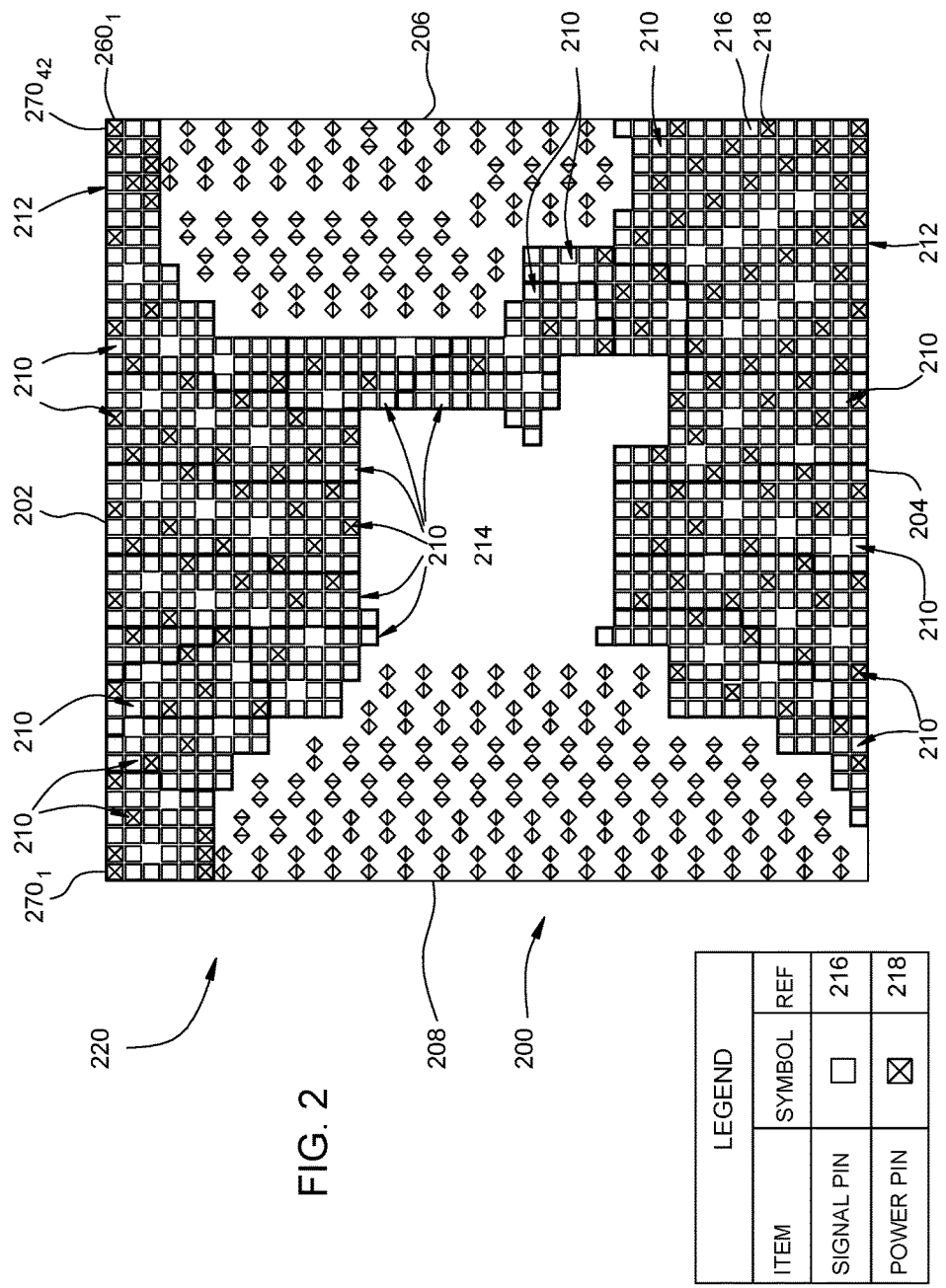
FIG. 2 is a schematic illustration of an interface layout of one example for a vertical interface.

FIG. 2 is a schematic illustration of an interface layout 200 of one example for a vertical interface 220. The vertical interface 220 may be any of the vertical interfaces 120 between components such as shown in FIG. 1, or between other vertically stacked components of an integrated circuit device. In the example depicted in FIG. 2, the interface layout 200 is that of an exemplary BGA.

The interface layout 200 is generally shown taken through the solder connections (such as solder connections 108 or 122 in FIG. 1) between facing surfaces of the components defining the interface. The interface layout 200 is generally bounded by edges 202, 204, 206, 208 that correspond to the edges of the component making up the vertical interface 220 that does not include escape routing. The interface layout 200 also includes edge regions 212 disposed proximate the edges 202, 204, 206, 208, a central interior region 214 surrounded by the edge regions 212, and a plurality of signal regions 210. Pluralities of data signal pins 216 and power signal pins 218 are distributed throughout the plurality of signal regions 210.

Figure 3:
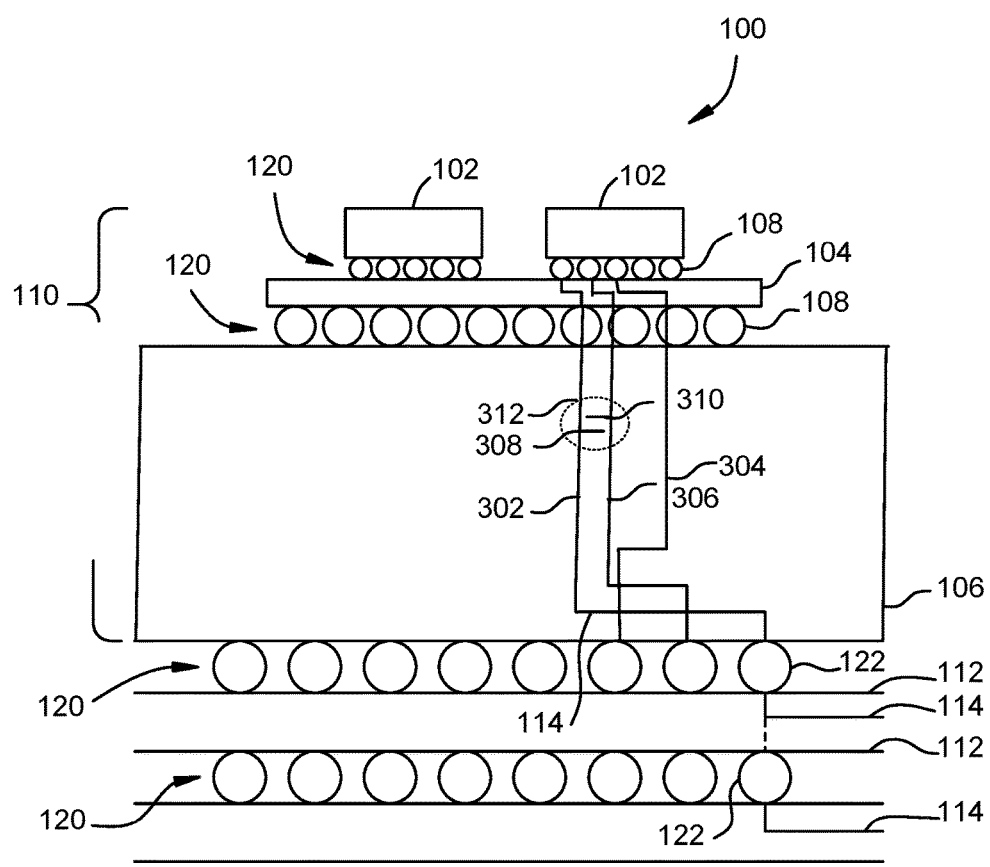
FIG. 3 is a cross sectional schematic view of the integrated chip package of FIG. 1 with the substrate enlarged to show horizontal and vertical interfaces comprising conductors extending vertically from a first semiconductor component.
Figure 4:
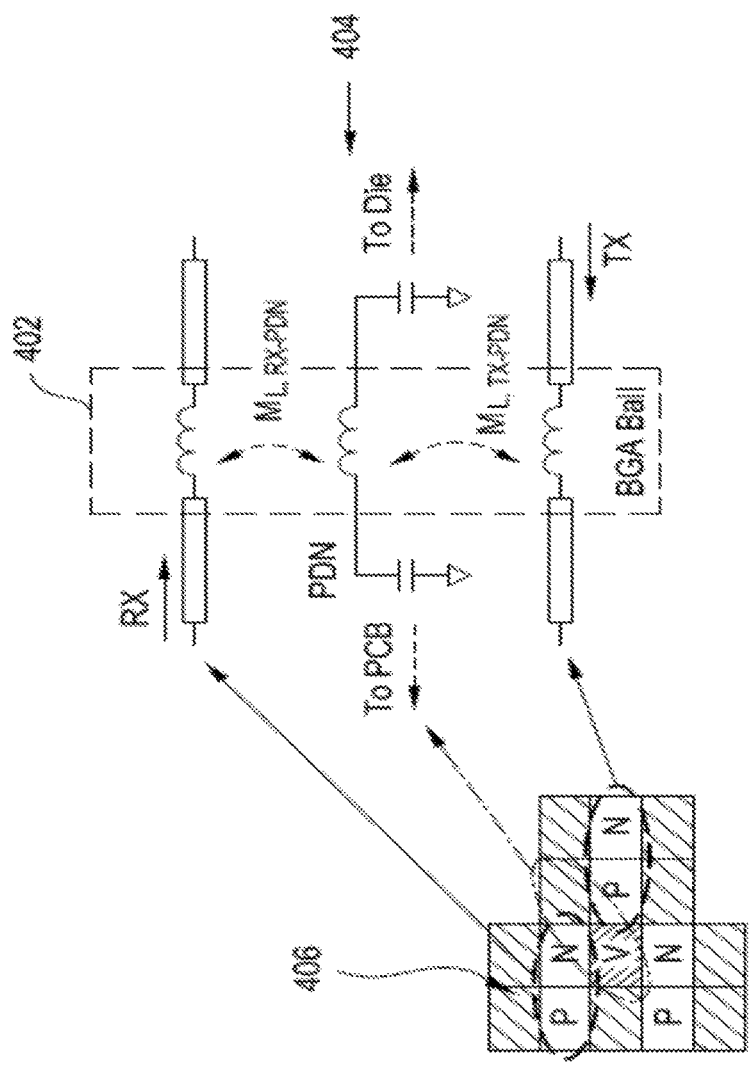
FIG. 4 shows the plate capacitor of FIG. 3 coupling to a mutual inductance of a power ground network to form a low pass filter configured to dampen crosstalk between signal conductors of a plurality of signal conductors.

FIG. 3 is a cross sectional schematic view of the of the integrated chip package of FIG. 1 with the package substrate 106 enlarged to show horizontal and vertical interfaces comprising conductors extending vertically from the one or more IC dies 102. A first one or more power signal conductors 302 extend vertically from a first semiconductor component (e.g., the integrated circuit (IC) dies 102) to a second semiconductor component stacked below the first component (e.g., the package substrate 106, the interposer 104, one of the printed circuit boards 112). A second one or more receive and transmit conductors 304 configured to carry data signals extending vertically from the first semiconductor component. A third one or more conductors 306 configured to carry ground signals extending vertically from the first semiconductor component. The first one or more power signal conductors 302 are further configured to shield and separate the second one or more receive and transmit conductors 304. A fourth one or more conductors 308 extends horizontally from the first one or more power signal conductors 302 adjacent to and terminating proximal to the third one or more conductors 306. A fifth one or more conductors 310 extending horizontally from the third one or more conductors 306 adjacent to and terminating proximal to the first one or more power signal conductors 302 and the fourth one or more conductors 308. The fourth one or more conductors 308 and the corresponding adjacent fifth one or more conductors 310 forms a plate capacitor 312. The plate capacitor 312 couples to a mutual inductance of a power ground network to form a low pass filter configured to dampen crosstalk between signal conductors of the second one or more receive and transmit conductors 304.

In an example, a ratio of a number of first one or more power signal conductors 302 to a number of second one or more receive and transmit conductors 304 is 3:1. In another example, a ratio of a number of first one or more power signal conductors 302 to a number of second one or more conductors 304 is 3:2. In another example, a ratio of a number of first one or more conductors 302 to a number of second one or more conductors 304 is 3:3.

In an example, a plurality of solder connections joining each of the first one or more power signal conductors 302, the second one or more conductors 304, and the third one or more conductors 306 to the IC dies 102 are arranged in a ball grid array.

More particularly, the plate capacitor 312 is formed between a vertical power signal conductor 302 configured to carry a power signal and a vertical receive and transmit conductor 304 configured to carry a ground signal. The plate capacitor 312 is shown extending horizontally from the vertical power signal conductor 302 and the vertical ground conductor 306. The plate capacitor 312 is formed by extending a first horizontal conductor 308 from the vertical power signal conductor 302 that is adjacent to but not contacting the vertical ground conductor 306, and extending a second horizontal conductor 310 from the vertical ground conductor 306 adjacent to but not touching either the first horizontal conductor 308 or the vertical power signal conductor 302. To be effective, the dimensions of the first horizontal conductor 308 and the second horizontal conductor 310 are in the range of 30 mm$^2$ to 100 mm$^2$. The capacitance formed therefrom is on the order of 1 picofarad. The horizontal conductors 308, 310 are shown embedded within the interposer 104. In other examples, the horizontal conductors 308, 310 may be formed in the package substrate 106 or the one of the PCBs 112.

Figure 5:
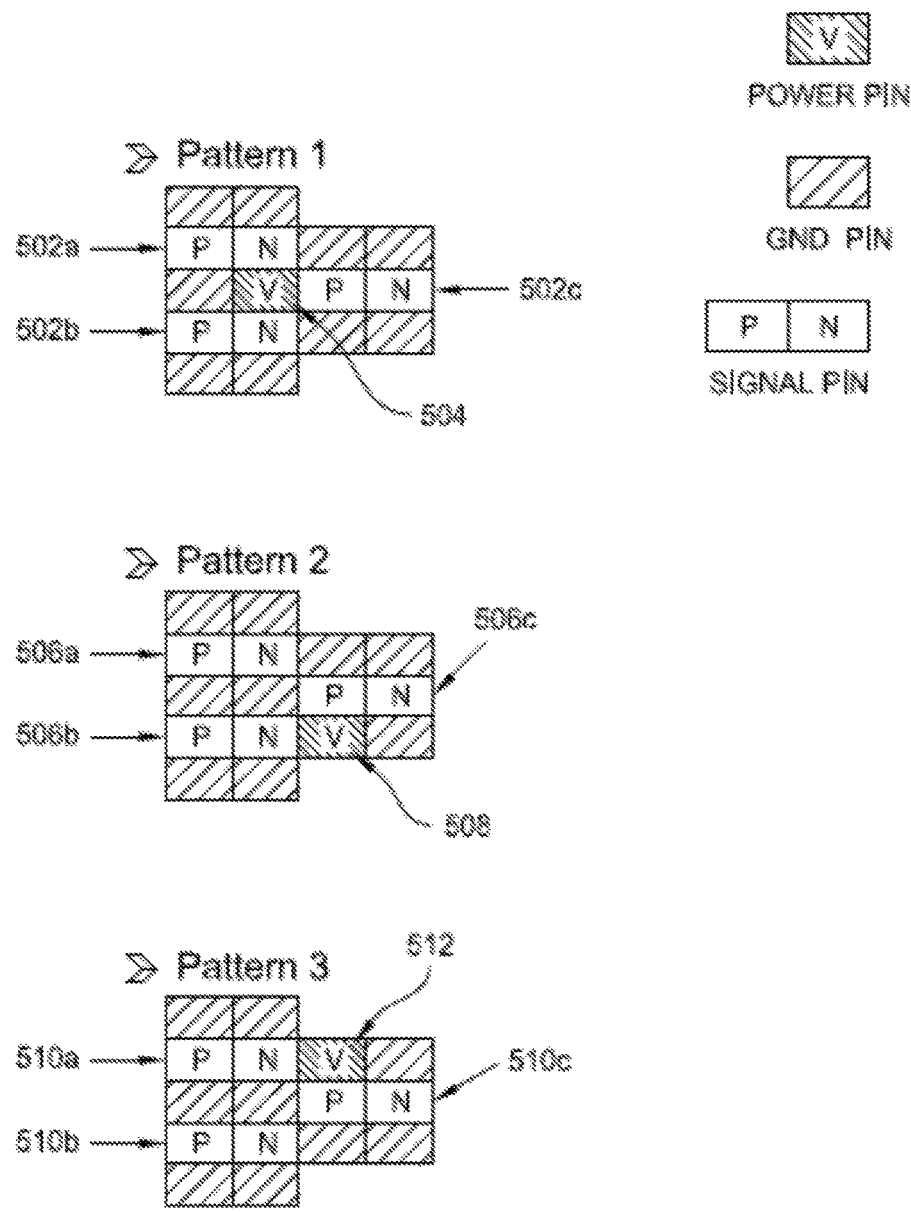
FIG. 5 is a schematic illustration of one example of an interface layout for a vertical interface between components such as shown in FIG. 1 having a power to signal ratio of 1:3.

FIG. 5 is a schematic illustration of one example of an interface layout for a vertical interface between components such as shown in FIG. 1 having a power to signal ratio of 1:3. For example, each group of three adjacent transmit signal pin-receive signal pin pairs 502a, 502b, 502c are associated with one power pin 504 for shielding the group of three adjacent transmit signal pin-receive signal pin pairs 502a, 502b, 502c. For pattern 1 of the group of three adjacent transmit signal pin-receive signal pin pairs 502a, 502b, 502c, the first power pin 504 is placed centrally adjacent to each of the three pairs of signal pins 502a, 502b, 502c. The first power pin 504 is configured to separate the transmit signal pin-receive signal pin pairs 502a, 502b, 502c. For pattern 2 of the group of three adjacent transmit signal pin-receive signal pin pairs 506a, 506b, 506c the first power pin 508 is placed centrally adjacent to a first two of the three pairs of signal pins but not the third pair. For pattern 3 of the group of three adjacent transmit signal pin-receive signal pin pairs 510a, 510b, 510c the first power pin 512 is placed centrally adjacent to a second two of the three pairs of signal pins but not the third pair.

Figure 6:
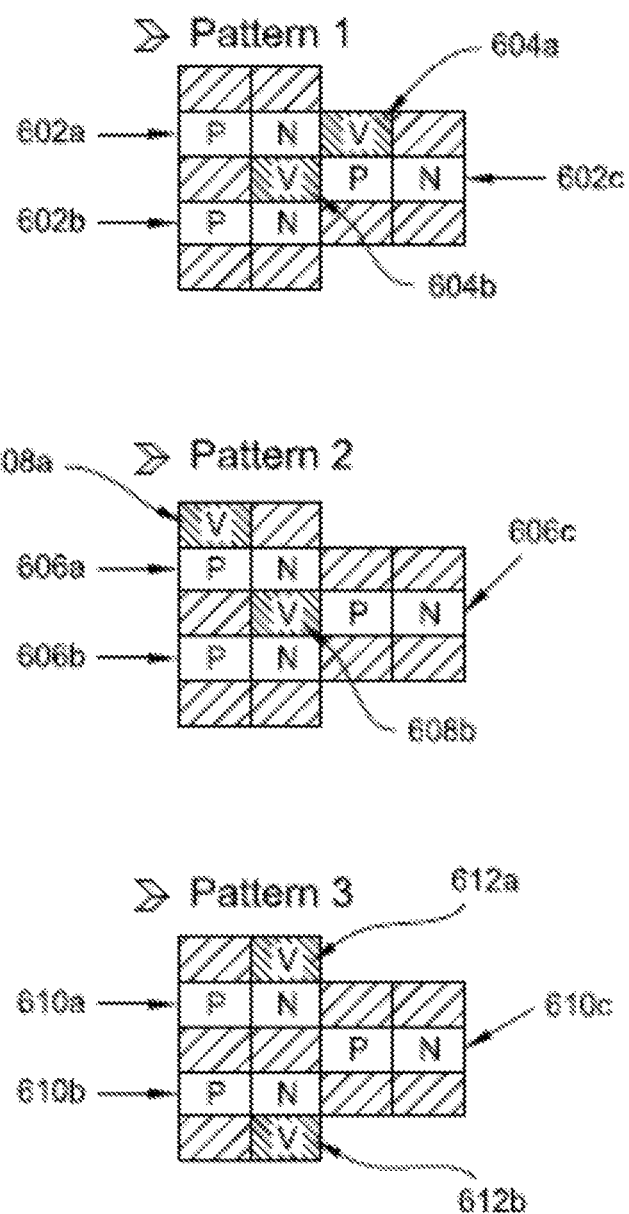
FIG. 6 is a schematic illustration of one example of an interface layout for a vertical interface between components such as shown in FIG. 1 having a power to signal ratio of 2:3.

FIG. 6 is a schematic illustration of one example of an interface layout for a vertical interface between components such as shown in FIG. 1 having a power to signal ratio of 2:3. For example, each group of three adjacent transmit signal pin-receive signal pin pairs 602a, 602b, 602c of conductors has 2 power pins 604a, 604b for shielding the group of three adjacent transmit signal pin-receive signal pin pairs 602a, 602b, 602c of conductors. The two power pin 604a, 604b are configured to separate the transmit signal pin-receive signal pin pairs 602a, 602b, 602c. For pattern 1 of the group of three adjacent transmit signal pin-receive signal pin pairs 602a, 602b, 602c, a first power pin 604a is placed centrally adjacent to each of the three pairs of signal pins 602a, 602b, 602c, and a second power pin 604b is placed centrally adjacent to a first two of three pairs of signal pins. For pattern 2 of the group of three adjacent transmit signal pin-receive signal pin pairs 606a, 606b, 606c, a first power pin 608a is placed centrally adjacent to each of the three pairs of signal pins 606a, 606b, 606c, and a second power pin 608b is placed centrally adjacent to a second two of three pairs of signal pins but not the third pair. For pattern 3 of the group of three adjacent transmit signal pin-receive signal pin pairs 610a, 610b, 610c, a first power pin 612a is placed centrally adjacent to a second two of three pairs of signal pins 610a, 610b, 610c, but not centrally adjacent to all three pairs of the group of three transmit signal pin-receive signal pin pairs 610a, 610b, 610c.

Figure 7:
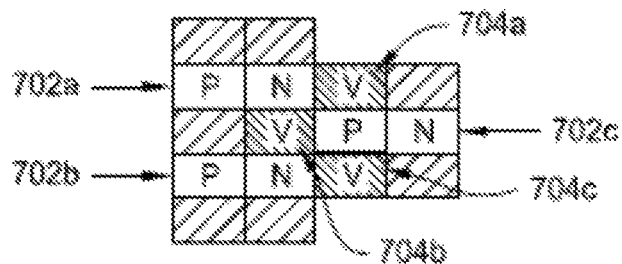
FIG. 7 is a schematic illustration of one example of an interface layout for a vertical interface between components such as shown in FIG. 1 having a power to signal ratio of 3:3.
Figure 7:
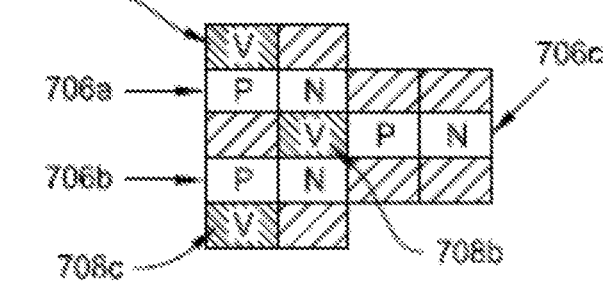
Figure 7:
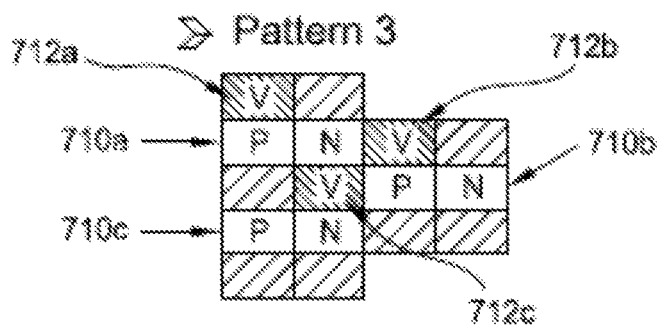

FIG. 7 is a schematic illustration of one example of an interface layout for a vertical interface between components such as shown in FIG. 1 having a power to signal ratio of 3:3. For example, each group of three adjacent transmit signal pin-receive signal pin pairs 702a, 702b, 702c, of conductors have 3 power pins 704a, 704b, 704c for shielding the group of three adjacent transmit signal pin-receive signal pin pairs 702a, 702b, 702c. The three power pins 704a, 704b, 704c are configured to separate the transmit signal pin-receive signal pin pairs 702a, 702b, 702c. For pattern 1 of the group of three adjacent transmit signal pin-receive signal pin pairs 702a, 702b, 702c, the three power pins 704a, 704b, 704c are placed symmetrical adjacent to all three of the three pairs of signal pins 702a, 702b, 702c. For pattern 2 of the group of three adjacent transmit signal pin-receive signal pin pairs 706a, 706b, 706c, a first power pin 708a is placed centrally adjacent to each of the three pairs of signal pins 702a, 702b, 702c. A second power pin 708b is placed adjacent to a second pair of signal pins and a third power pin 708c is placed adjacent to a third pair of signal pins but not the first pair. For pattern 3 of the group of three adjacent transmit signal pin-receive signal pin pairs 710a, 710b, 710c, a first power pin 712a is placed centrally adjacent to each of the three pairs of signal pins 710a, 710b, 710c. A second power pin is placed centrally adjacent to a second pair of signal pins and the first pair of signal pins but not the third pair of signal pins.

FIG. 8A shows an exemplary horizontal layout of signal, power, and ground connections between two transceivers as indicated by the oval 805. FIG. 8B shows an equivalent electrical schematic representation of transmit signal impedance, receive signal impedance and a power ground layout impedance having plate capacitors formed therebetween. FIG. 8C is a graph illustrating a relationship between crosstalk and frequency for the layout shown in FIGS. 8A and 8B. FIG. 8D is an equivalent schematic circuit diagram for a power-ground distribution transmission line circuit that includes plate capacitors 810a, 810b, 810c formed between vertical conductors as described in FIG. 3. In FIGS. 8B and 8D, the BGA balls overlying and underlying the plate capacitors 810*a*, 810*b*, 810*c* each have a mutual inductance Mm, PX-PDN, ML, Tx-PDN coupled to the plate capacitors 810*a*, 810*b*, 810*c*, the receive and transmit conductors 304, extending from the one or more PCBs 112 to the IC dies 102. The plate capacitors 810*a*, 810*b*, 810*c*, and the mutual inductance form low pass filters in the power and ground network to suppress crosstalk peaks. The plot of FIG. 8C shows a peak PDN impedance and signal to PDN coupling in the range of 10 GHz to 50 GHz, the frequency at which the IC dies 102 may operate. FIG. 8C shows peak crosstalk in the power ground network without the intervening plate capacitors 810*a*, 810*b*, 810*c*. The plate capacitors 810*a*, 810*b*, 810*c* suppress differential crosstalk in the power-ground network by as much as 17 dB-20 dB. The amount of crosstalk suppression can be tailored to fit any frequency peak and any magnitude. Examples of the present disclosure have many advantages over ground-reference-only power and ground distribution network designs. The power co-references separating transceiver signals coupled with the horizontal capacitors 810*a*, 810*b*, 810*c* serve to damp intrinsic power-ground resonances, suitable for noise cancellation up to a 50 Ghz bandwidth. The novel power-ground network design achieves −50 dB coupling between transmit and receive between transmit and receive conductors, as well as suppressing differential coupling by as much as 20 dB as compared to ground-reference only power and ground network designs. The use of power pin co-references also increases the density of transceivers located on a die from e.g., 128 to 192 transceivers in the same package. The novel designed present above also provide additional PCB space with no impact to PCB escape routing. There is no impact to characteristic impedance, return loss, or channel loss in the entire chip package 100.

Figure 9:
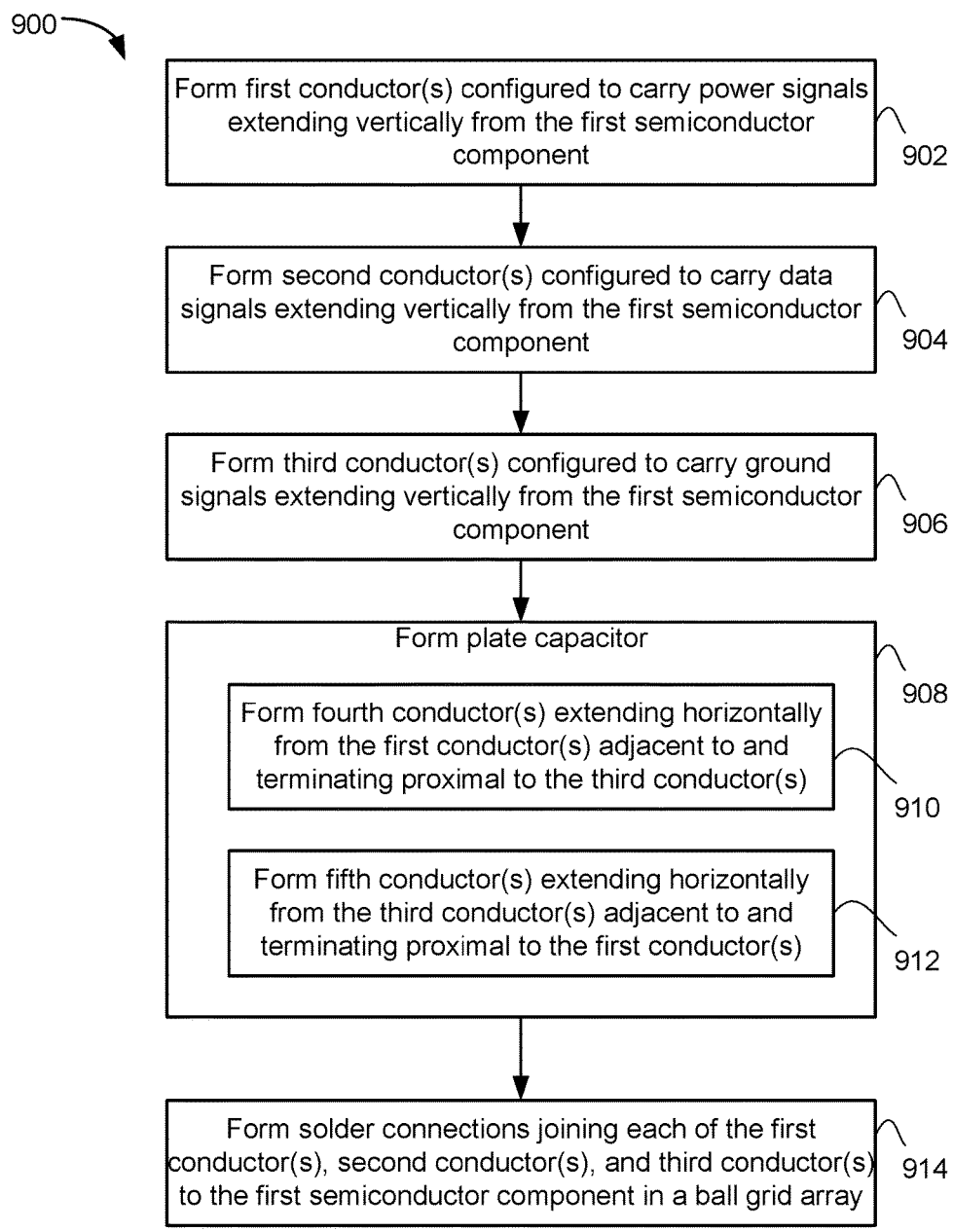
FIG. 9 is a flow diagram depicting a method of manufacturing an interface layout for a vertical interface of a first semiconductor component according to an example.

FIG. 9 is a flow diagram depicting a method 900 of manufacturing an interface layout for a vertical interface of a first semiconductor component according to an example. The method 900 begins at step 902, where first conductor(s) are formed, which are configured to carry power signals extending vertically from the first semiconductor component. At step 904, second conductor(s) are formed, which are configured to carry data signals extending vertically from the first semiconductor component. At step 906, third conductor(s) are formed, which are configured to carry ground signals extending vertically from the first semiconductor component. At step 908, a plate capacitor is formed. For example, at step 910, fourth conductor(s) are formed, which extend horizontally from the first conductor(s) adjacent to and terminating proximal to the third conductor(s). At step 912, fifth conductor(s) are formed, which extend horizontally from the third conductor(s) adjacent to and terminating proximal to the first conductor(s). At step 914, solder connections are formed, which join each of the first conductor(s), second conductor(s), and third conductor(s) to the first semiconductor component in a ball grid array. Steps 900 . . . 914 can be performed by one or more semiconductor manufacturing tools, each of which performs etching, deposition, and the like to form the various conductors.

While the foregoing is directed to examples of the present disclosure, other and further examples may be devised without departing from the basic scope thereof, and the scope thereof is determined by the claims that follow.

What is claimed is:

1. An interface layout for a vertical interface of a first semiconductor component, comprising:
a first one or more conductors configured to carry power signals extending vertically from the first semiconductor component;
a second one or more conductors configured to carry data signals extending vertically from the first semiconductor component;
a third one or more conductors configured to carry ground signals extending vertically from the first semiconductor component,
wherein the first one or more conductors are further configured to shield and separate the second one or more conductors;
a fourth one or more conductors extending horizontally from the first one or more conductors adjacent to and terminating proximal to the third one or more conductors; and
a fifth one or more conductors extending horizontally from the third one or more conductors adjacent to and terminating proximal to the first one or more conductors and the fourth one or more conductors,
wherein the fourth one or more conductors and the corresponding adjacent fifth one or more conductors forms a plate capacitor.

2. The interface layout of claim 1, wherein the plate capacitor couples to a mutual inductance of a power ground network to form a low pass filter configured to dampen crosstalk between signal conductors of the second one or more conductors.

3. The interface layout of claim 1, wherein the ratio of a number of first one or more conductors to a number of second one or more conductors is 3:1.

4. The interface layout of claim 1, wherein the ratio of a number of first one or more conductors to a number of second one or more conductors is 3:2.

5. The interface layout of claim 1, wherein the ratio of a number of first one or more conductors to a number of second one or more conductors is 3:3.

6. The interface layout of claim 1, wherein a plurality of solder connections joining each of the first one or more conductors, the second one or more conductors, and the third one or more conductors to the first semiconductor component are arranged in a ball grid array.

7. The interface layout of claim 1, wherein the first semiconductor component is an integrated circuit (IC) die.

8. The interface layout of claim 1, wherein the first semiconductor component is an interposer.

9. The interface layout of claim 1, wherein the first semiconductor component is a package substrate.

10. The interface layout of claim 1, wherein the first one or more conductors, the second one or more conductors, and the third one or more conductors extend vertically from the first semiconductor component to a second semiconductor component stacked below the first semiconductor component.

11. The interface layout of claim 10, wherein the second semiconductor component is a printed circuit board.

12. The interface layout of claim 10, wherein the second semiconductor component is an interposer.

13. The interface layout of claim 10, wherein the second semiconductor component is a package substrate.

14. The interface layout of claim 10, wherein the second semiconductor component is a printed circuit board.

15. A vertical interface between stacked components of an integrated circuit device, the vertical interface comprising:
a first plurality of conductors configured to carry power signals extending vertically from a first semiconductor component comprising circuitry to a second semiconductor component stacked below the first semiconductor component;

a second plurality of conductors configured to carry data signals extending vertically from the first semiconductor component comprising circuitry to the second semiconductor component;

a third plurality of conductors configured to carry ground signals extending vertically from the first semiconductor component to the second semiconductor component, wherein the first plurality of conductors are further configured to shield and separate the second plurality of conductors, a fourth plurality of conductors extending horizontally in the second component from the first plurality of conductors adjacent to and terminating proximal to the third plurality of conductors; and a fifth plurality of conductors extending horizontally in the second component from the third plurality of conductors adjacent to and terminating proximal to the first plurality of conductors and the fourth plurality of conductors.

16. The vertical interface of claim 15, wherein each pair of conductors comprising one conductor of the fourth plurality of conductors and a corresponding adjacent conductor of the fifth plurality of conductors forms a plate capacitor.

17. The vertical interface of claim 16, wherein the plate capacitor couples to a mutual inductance of a power ground network to form a low pass filter configured to dampen crosstalk between signal conductors of the second plurality of conductors.

18. The vertical interface of claim 15, wherein the ratio of a number of first plurality of conductors to a number of second plurality of conductors is 3:1.

19. The vertical interface of claim 15, wherein the ratio of a number of first plurality of conductors to a number of second plurality of conductors is 3:2.

20. The vertical interface of claim 15, wherein the ratio of a number of first plurality of conductors to a number of second plurality of conductors is 3:3.

\* \* \* \* \*